United States Patent
Lee

(10) Patent No.: US 9,887,157 B2
(45) Date of Patent: Feb. 6, 2018

(54) SEMICONDUCTOR DEVICE AND METHOD OF MANUFACTURING THE SAME

(71) Applicant: SK hynix Inc., Gyeonggi-do (KR)

(72) Inventor: Hyun Ho Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 81 days.

(21) Appl. No.: 14/151,535

(22) Filed: Jan. 9, 2014

(65) Prior Publication Data

US 2015/0054171 A1 Feb. 26, 2015

(30) Foreign Application Priority Data

Aug. 21, 2013 (KR) ........................ 10-2013-0099068

(51) Int. Cl.
| | | |
|---|---|---|
| *H01L 29/792* | (2006.01) | |
| *H01L 23/528* | (2006.01) | |
| *H01L 23/522* | (2006.01) | |
| *H01L 27/11575* | (2017.01) | |

(52) U.S. Cl.
CPC ...... *H01L 23/5283* (2013.01); *H01L 23/5226* (2013.01); *H01L 27/11575* (2013.01); *H01L 2924/0002* (2013.01)

(58) Field of Classification Search
CPC .......... H01L 23/5283; H01L 27/11575; H01L 23/5226; H01L 2924/0002
See application file for complete search history.

(56) References Cited

U.S. PATENT DOCUMENTS

| | | | |
|---|---|---|---|
| 2008/0073635 A1* | 3/2008 | Kiyotoshi et al. | ................ 257/2 |
| 2009/0242967 A1* | 10/2009 | Katsumata | ............ H01L 21/764 257/324 |
| 2010/0039865 A1* | 2/2010 | Kidoh et al. | ............. 365/185.23 |
| 2010/0096682 A1* | 4/2010 | Fukuzumi | ......... H01L 27/11565 257/314 |
| 2010/0097859 A1* | 4/2010 | Shim et al. | .............. 365/185.05 |
| 2013/0032875 A1* | 2/2013 | Yun | ................... H01L 29/66833 257/324 |

FOREIGN PATENT DOCUMENTS

| | | |
|---|---|---|
| CN | 101447502 | 6/2009 |
| KR | 1019920017227 | 9/1992 |

OTHER PUBLICATIONS

Office Action issued by the State Intellectual Property Office dated Aug. 31, 2017.

* cited by examiner

*Primary Examiner* — Su C Kim
(74) *Attorney, Agent, or Firm* — IP & T Group LLP

(57) ABSTRACT

A semiconductor device and a method of manufacturing the same are provided. The semiconductor device includes a substrate on which a contact region and a cell region are defined, sub-patterns formed in the contact region, on the substrate, and insulating patterns and conductive patterns stacked alternately along the sub-patterns.

17 Claims, 7 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2013-0099068, filed on Aug. 21, 2013, in the Korean Intellectual Property Office, which is incorporated herein by reference in its entirety.

BACKGROUND

1. Technical Field

Various embodiments of the present invention relate to a semiconductor device and a method of manufacturing the same. More specifically, the embodiments of the present invention relate to a semiconductor device including a contact region and a method of manufacturing the same.

2. Related Art

A semiconductor device includes conductive patterns, and insulating layers disposed between the conductive patterns and insulating the conductive patterns. A portion of each conductive pattern may be used as a contact region that is connected to a contact plug.

For example, a three-dimensional semiconductor device includes a stack structure in which conductive patterns and insulating layers are alternately stacked. The end of the stack structure is patterned as a stepped structure and used as a contact region. Contact plugs are connected on the conductive patterns with the stepped structure. The contact plugs include a top portion to which a wire transmitting a signal is connected, and may transmit the signal to the conductive patterns.

According to high-density integration of a semiconductor device, a level of difficulty of a process of connecting the contact region of the conductive pattern and the contact plug is increasing. Particularly, there is a concern that the contact plug penetrates the target conductive pattern and is connected to another conductive pattern, or the contact plug fails to reach to the upper side of the target conductive pattern.

SUMMARY

Various embodiments of the present invention are directed to a semiconductor device and a method of manufacturing the same that may lower a level of difficulty of a process.

One aspect of the present invention provides a semiconductor device including a substrate on which a contact region and a cell region are defined, sub-patterns formed in the contact region, on the substrate, and insulating patterns and conductive patterns stacked alternately along the sub-patterns.

Another aspect of the present invention provides a semiconductor device including a substrate, a sub-pattern formed on the substrate, a conductive pattern formed along the sub-pattern, wherein the conductive pattern includes a portion covering the sub-pattern, and a contact plug connected to the portion of the conductive pattern.

Still another aspect of the present invention provides a method of manufacturing a semiconductor device including forming sub-patterns on a substrate, forming a stepped structure including insulating patterns and conductive patterns, wherein the insulating patterns and the conductive patterns are stacked alternately along the sub-patterns, and forming contact plugs connected to the conductive patterns of the stepped structure.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Figure 1:
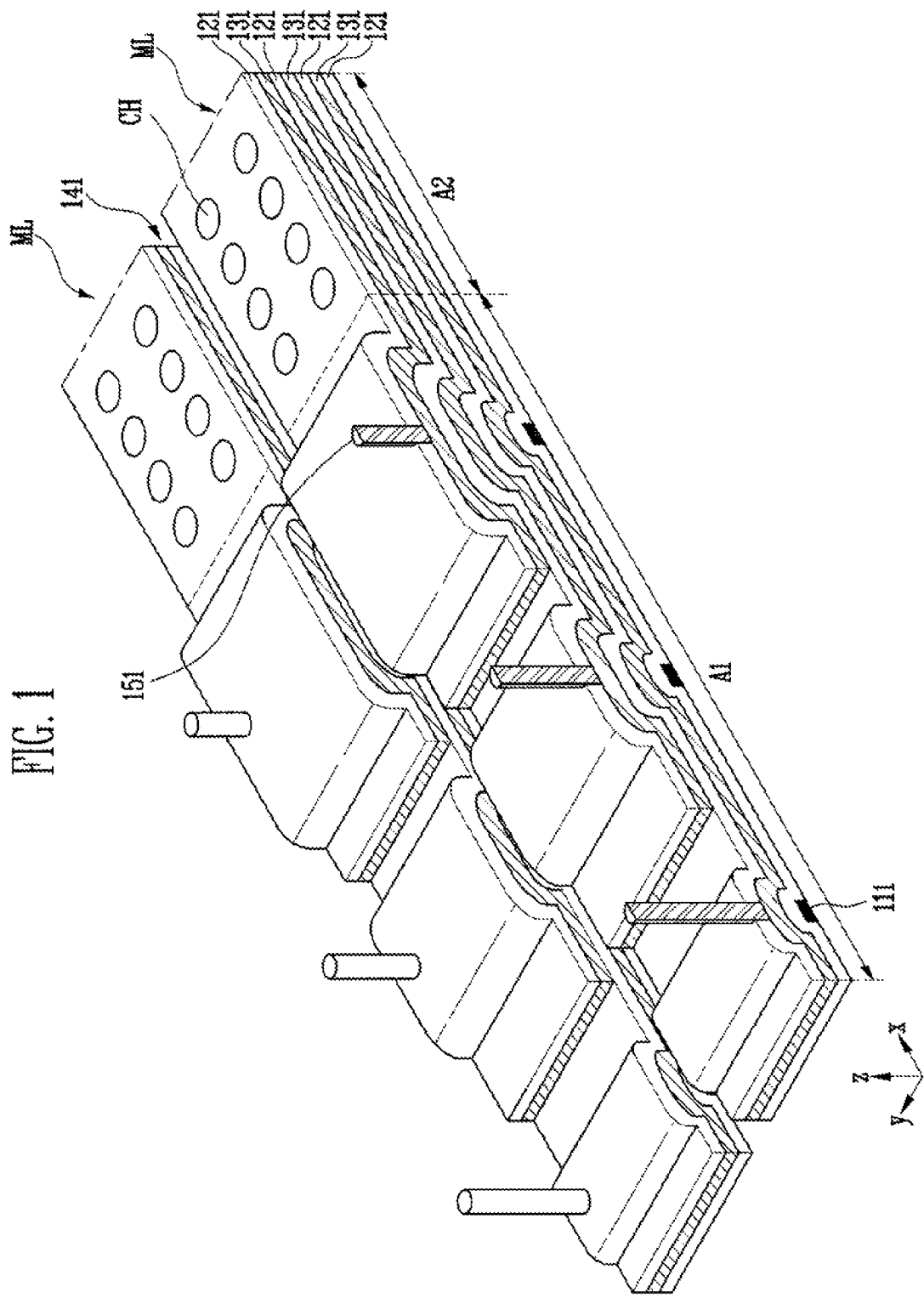
FIG. 1 is a perspective view illustrating a semiconductor device according to an embodiment of the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a perspective view illustrating a semiconductor device according to an embodiment of the present invention. Particularly, FIG. 1 illustrates a three-dimensional semiconductor device as an example.

Referring to FIG. 1, the semiconductor device includes a substrate (not shown) on which a contact region A1 and a cell region A2 are defined, sub-patterns 111 formed in the contact region A1, on the substrate, stack structures ML including insulating patterns 121 and conductive patterns 131, which are alternately stacked on the substrate on which the sub-patterns 111 are formed, a slit 141 for separating adjacent stack structures ML, and contact plugs 151 connected to the conductive patterns 131 of the stack structures ML in the contact region A1.

The sub-patterns 111 are arranged to be spaced apart from each other in the contact region A1. Further, the sub-patterns 111 may be patterned with a line shape in one direction. The sub-patterns 111 are formed to provide step differences on the substrate, and may be formed of an insulating material or a conductive material.

Each of the stack structures ML includes the insulating patterns 121 and the conductive patterns 131, which extend from the contact region A1 to the cell region A2. The ends of the insulating patterns 121 and the conductive patterns 131 form a stepped structure in the contact region A1. Each step of the stepped structure may include at least one of the insulating patterns 121 and at least one of the conductive patterns 131. The insulating pattern 121 and the conductive pattern 131 included in each step of the stepped structure may be arranged adjacent to each other. The sub-patterns 111 are arranged in lower portions of steps of the stepped structure. Accordingly, each step of the stepped structure may be upwardly bent in the contact region A1. Hereinafter, shapes of the insulating patterns 121 and the conductive patterns 131 forming the stepped structure through the sub-patterns 111 will be explained in detail.

Each of the insulating patterns 121 and the conductive patterns 131 includes first portions formed along surfaces of the sub-patterns 111, and second portions formed along surfaces of the substrate (not shown). The first portions are curved areas arranged on the sub-patterns 111. Namely, the first portions cover the sub-patterns 111. The second portions are planar areas arranged on portions of the substrate exposed through the sub-patterns 111. Namely, the second portions are located between the sub-patterns 111. The first portions of the insulating patterns 121 and the conductive patterns 131 may be formed to have greater thicknesses than those of the second portions of the insulating patterns 121 and the conductive patterns 131, respectively, depending on widths and heights of the sub-patterns 111.

The contact plugs 151 are connected to the first portions of the conductive patterns 131, and protrude to the upper portions of the conductive patterns 131.

The insulating patterns 121 and the conductive patterns 131 formed in the cell region A2 are penetrated by channel layers CH. A sidewall of each channel layer CH may be surrounded by a thin layer including at least one of a tunnel insulating layer, a data storage layer, and a blocking insulating layer.

Since the first portions of the conductive patterns 131 may be bent, and the first portions of the conductive patterns 131 may have a greater thickness than those of the second portions of the conductive patterns 131 in an embodiment of the present invention, the present invention may reduce contact defects and the contact plugs 151 may be easily connected to the conductive patterns 131.

Figure 2A:
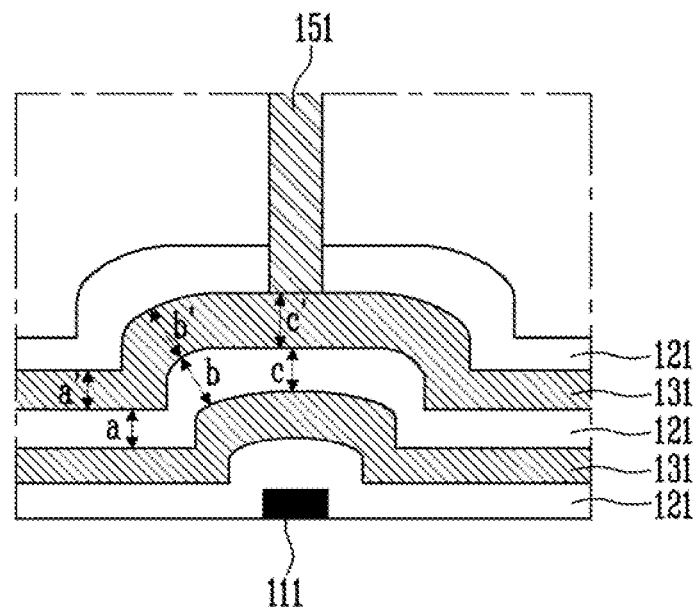
FIGS. 2A and 2B are cross-sectional views in which a portion of a region of the semiconductor device of FIG. 1 is enlarged, illustrating effects of the semiconductor device of FIG. 1, according to an embodiment of the present invention.
Figure 2B:
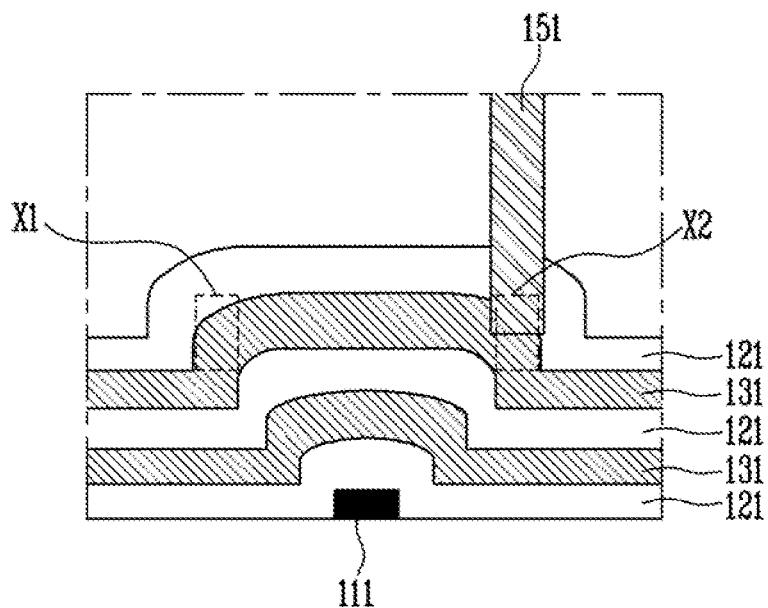

FIGS. 2A and 2B are cross-sectional views in which a portion of a region of the semiconductor device of FIG. 1 is enlarged, illustrating effects of the semiconductor device of FIG. 1, according to an embodiment of the present invention. Particularly, FIGS. 2A and 2B illustrate cross-sectional views taken along the x-axis shown in FIG. 1.

Referring to FIGS. 2A and 2B, the sub-patterns 111 provide step differences on the substrate (not shown). When forming deposition layers (for example, 121 and 131) along the surface of the substrate including step differences defined by the sub-patterns 111, portions of the deposition layers formed on the sub-patterns 111 may be upwardly bent (i.e., curved areas), and portions of the deposition layers formed on areas of the substrate on which the sub-patterns 111 are not formed may be formed evenly (i.e., planar areas). At this time, thicknesses of the curved areas of the deposition layers formed on the sub-patterns 111, which protrude from the planar areas of the deposition layers, may be greater than those of the planar areas of the deposition layers, respectively, formed on the substrate on which the sub-patterns are not formed. Deposition conditions of the deposition layers, and widths and heights of the sub-patterns 111 may be preset so that thicknesses of the curved areas of the deposition layers are greater than those of the planar areas of the deposition layers, respectively. Here, the deposition conditions of the deposition layers, the widths and the heights of the sub-patterns 111 may be variously set according to design conditions.

For example, as shown in FIG. 2A, the thicknesses b and c of the first portion (the curved area) of the insulating pattern 121 may be greater than the thickness a of the second portion (the planar area) of the Insulating pattern 121, and the thicknesses b' and c' of the first portion (the curved area) of the conductive pattern 131 may be greater than the thickness a' of the second portion (the planar area) of the conductive pattern 131, by adjusting the width and the height of the sub-pattern 111. Accordingly, in an etching process of forming a contact hole to open the first portion of the conductive pattern 131 in order to form the contact plug 151, a sufficient etching margin may be guaranteed since a thickness of the conductive pattern 131 to be opened by the contact hole is great.

Further, since the conductive pattern 131 includes the first portion that is the curved area, a contact area of the conductive pattern 131 may be increased by areas X1 and X2 shown in FIG. 2B as compared with the case in which the conductive pattern 131 is evenly formed without the curved area. Accordingly, even if the contact plug 151 is shifted due to process errors, an overlay margin between the contact plug 151 and the conductive pattern 131 is guaranteed due to the contact plug 151 being connected to the first portion of the conductive pattern 131 as shown in FIGS. 2A and 2B.

An etching margin in a process of forming the contact hole may be maximally guaranteed when the contact plug 151 is arranged to be connected to the edge of the first portion of the conductive pattern 131 as shown in FIG. 2B.

FIGS. 3A to 3F are cross-sectional views illustrating a method of manufacturing a semiconductor device according to an embodiment of the present invention. Particularly, FIGS. 3A to 3F illustrate cross-sectional views taken along the x-axis of the contact area.

Figure 3A:
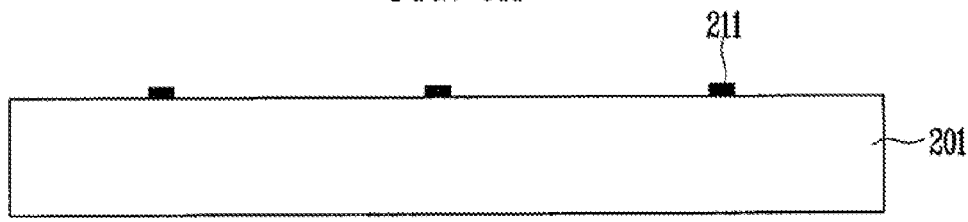
FIGS. 3A to 3F are cross-sectional views illustrating a method of manufacturing a semiconductor device according to an embodiment of the present invention.

As shown in FIG. 3A, sub-patterns 211 are formed on a substrate 201. An intermediate resulting material from a process of forming the sub-patterns 211 on the substrate 201 has a surface with step differences. Accordingly, first and second material layers (221 and 231 of FIG. 3B), which are subsequently deposited, may be bent. Meanwhile, a spaced distance between the sub-patterns 211 may be set to be suitable for a total deposition thickness of the first and second material layers 221 and 231 so that each of the first and second material layers 221 and 231 is formed to bend. Further, a width and a height of each of the sub-patterns 211 are set to be suitable for process conditions so that a thickness of the curved area of each of the first and second material layers 221 and 231 covering the sub-patterns 211 is greater than that of the planar area of each of the first and second material layers 221 and 231 formed on the substrate 201 on which the sub-patterns 211 are not formed.

Figure 3B:
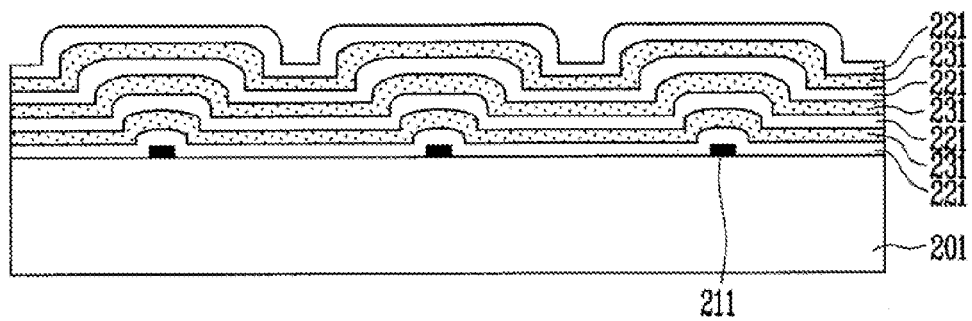

As shown in FIG. 3B, the first and second material layers 221 and 231 are alternately formed along the surface of the intermediate resulting material from the process of forming the sub-patterns 211 on the substrate 201. The first and second material layers 221 and 231 include first portions and second portions. The first portions are formed along surfaces of the sub-patterns 211 and are upwardly bent. The first portions cover the sub-patterns 211. The second portions are formed along surfaces of substrate 201 exposed through the sub-patterns 211. Namely, the second portions are located between the sub-patterns 211. Thicknesses of the first portions of the first and second material layers 221 and 231 may be greater than those of the second portions of the first and second material layers 221 and 231.

The first and second material layers 221 and 231 may be formed of various materials.

As one example, the first material layers 221 may include an insulating pattern material, and the second material layers 231 may include a conductive pattern material. More specifically, for example, the first material layers 221 include silicon oxide layers, and the second material layers 231 include any one of polysilicon layers, metal silicide layers, and metal layers.

As another example, the first material layers 221 may include an insulating pattern material, and the second material layers 231 may include a sacrificial material with etch selectivity with respect to the insulating pattern material of the first material layers 221. More specifically, for example, the first material layers 221 include silicon oxide layers, and the second material layers 231 include silicon nitride layers.

As still another example, the first material layers 221 include a sacrificial material with etch selectivity with respect to a material of the second material layers 231, and the material of the second material layers 231 includes a conductive pattern material. More specifically, for example, the first material layers 221 include undoped polysilicon layers, and the second material layers 231 include doped polysilicon layers.

Hereinafter, the example in which the first material layers 221 include an insulating pattern material, and the second material layers 231 include a sacrificial material will be explained with reference to the drawings.

Figure 3C:
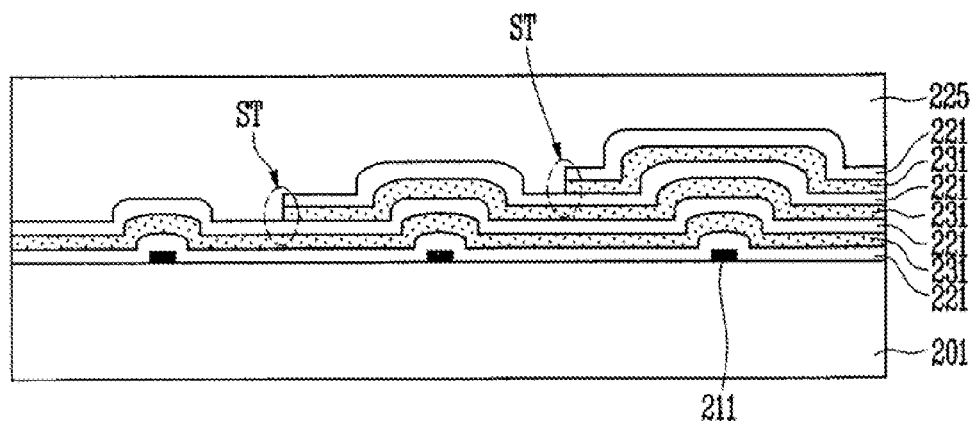

As shown in FIG. 3C, the ends of the first and second material layers 221 and 231 are patterned as a stepped structure ST. The stepped structure ST includes a plurality of steps, and each step may include at least one of the first material layers 221 and at least one of the second material layers 231. The first and second material layers 221 and 231 included in the each step of the stepped structure ST are arranged adjacently. A process of patterning to form the stepped structure ST includes forming a photo resist pattern (not shown) on the first and second material layers 221 and 231, and etching the first and second material layers 221 and 231 by a height of step difference of each step forming the stepped structure ST through an etching process using the photo resist pattern as an etching barrier. Here, each time the first and second material layers 221 and 231 are etched and a lower portion layer of an etched area is exposed, the etching of the first and second material layers 221 and 231 is repetitively performed while decreasing a size of the photo resist pattern. The photo resist pattern may be removed after forming the stepped structure ST.

For reference, although not shown in the drawings, before or after patterning the first and second material layers 221 and 231 as the stepped structure, processes of forming memory cells in the cell region may be performed. For example, after forming a hole penetrating the first and second material layers 221 and 231 in the cell region, a channel layer is formed in the hole. A cross-section of the hole may have various shapes such as a circle, an oval, a polygon, and so on. The channel layer may be formed by filling the inside of the hole with a semiconductor material such as polysilicon, etc., or along a sidewall of the hole by opening the center area of the hole. When the center area of the hole is opened by the channel layer, the opened center area of the hole may be filled with an insulating material. The channel layer may be formed in various structures. For example, the channel layer may be formed in a straight structure that penetrates the first and second material layers 221 and 231 in a vertical direction with respect to the surface of the substrate 201. In another example, the channel layer may be formed in a structure in which at least two straight regions in a perpendicular direction with respect to the surface of the substrate 201 and a pipe region connecting the straight regions, in a horizontal direction with respect to the surface of the substrate 201, are included.

Before forming the channel layer, a thin layer is formed on the sidewall of the hole. The thin layer may include at least one of a blocking insulating layer, a data storage layer, and a tunnel insulating layer.

Next, an Insulating layer 225 covering the first and second material layers 221 and 231 which are patterned as the stepped structure is formed. After this, a slit (141 of FIG. 1) penetrating the insulating layer 225, the first material layer 221 and the second material layer 231 is formed. The slit 141 exposes sidewalls of the first and second material layers 221 and 231, and splits the first and second material layers 221 and 231 into a plurality of the stepped structures.

When the first material layers 221 are formed of an insulating pattern material and the second material layers 231 are formed of a conductive pattern material, the stack structure ML shown in FIG. 1 may be formed through the slit 141.

Figure 3D:
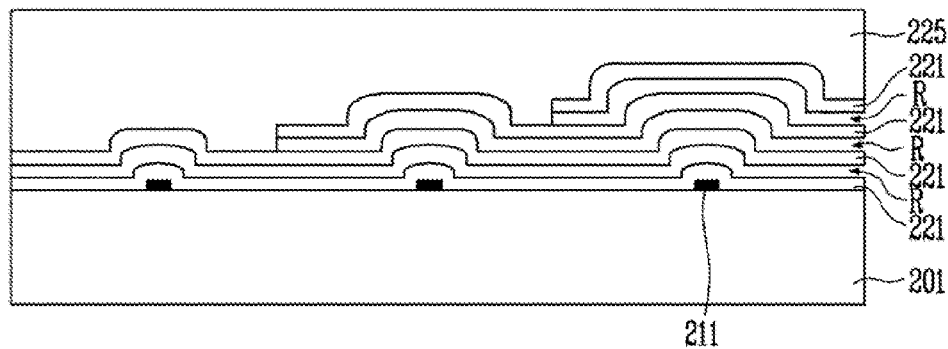

As shown in FIG. 3D, when the first material layers 221 are formed of an insulating pattern material and the second material layers 231 are formed of a sacrificial material, recess areas R are formed by removing the second material layers 231 exposed through the slit 141.

Figure 3E:
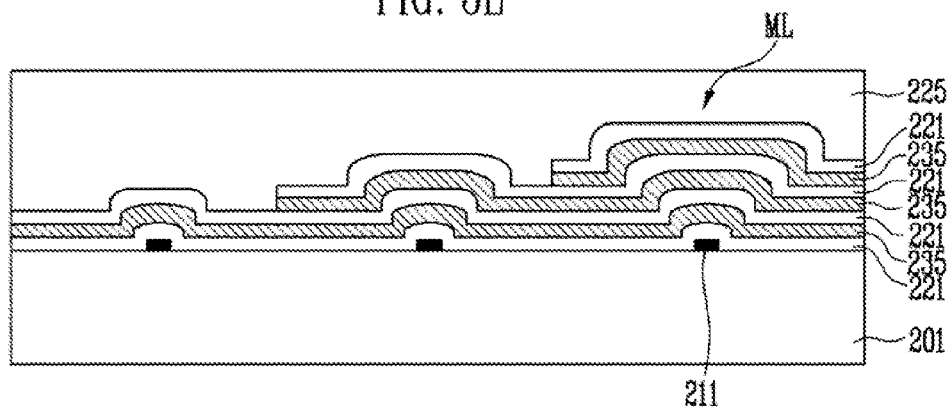

As shown in FIG. 3E, conductive patterns 235 are formed by filling the inside of each of the recess areas R with a conductive material. Accordingly, the stack structure ML shown in FIG. 1 is formed. Before filling the inside of each of the recess areas R with the conductive material, a thin layer including at least one of a tunnel insulating layer, a data storage layer, and a blocking insulating layer is formed.

Although not shown in the drawings, when the first material layers 221 are formed of a sacrificial material and the second material layers are formed of a conductive pattern material, after forming the recess areas by removing the exposed first material layers 221 through the slit 141, the stack structure ML shown in FIG. 1 may be formed by filling the inside of each of the recess areas with an insulating material.

Figure 3F:
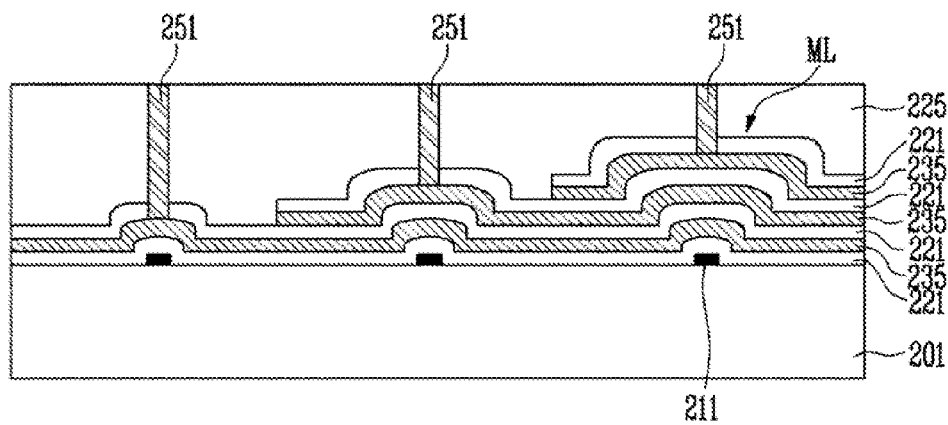

Referring to FIG. 3F, after filling the slit 141 splitting the stack structure ML with an insulating material (not shown), contact holes are formed to expose each of the conductive patterns 235 of the stack structure ML by etching the insulating layer 225 of an upper portion of the stack structure ML. After this, the contact plugs 251 connected to each of the conductive patterns 235 of the stack structure ML are formed by filling the inside of each of the contact holes with a conductive material.

The contact holes are formed on the sub-patterns 211 so that the contact plugs 251 are connected to first portions of the conductive patterns 235 along the sub-patterns 211. The contact holes are alternately arranged in zigzags.

The contact holes are formed to have different depths depending on heights of the conductive patterns 235. Accordingly, in the process of etching the contact holes, the contact holes may fail to reach to the respective depths at which the respective conductive patterns targeted by the contact holes are located. If over-etching is performed in order to prevent this concern in the process of etching the contact holes, a conductive pattern disposed under a conductive pattern targeted by a contact hole may be exposed rather than the conductive pattern targeted by the contact hole. However, according to an embodiment of the present invention, an etching margin may be guaranteed even when over-etching is performed since the contact holes are arranged to expose the first portions of the conductive patterns 235, and the first portions of the conductive patterns 235 are formed to have a greater thickness than that of other portions. Accordingly, an embodiment of the present invention may resolve a concern that the contact holes are not opened, and may reduce a punch phenomenon of the conductive patterns 235.

Figure 4:
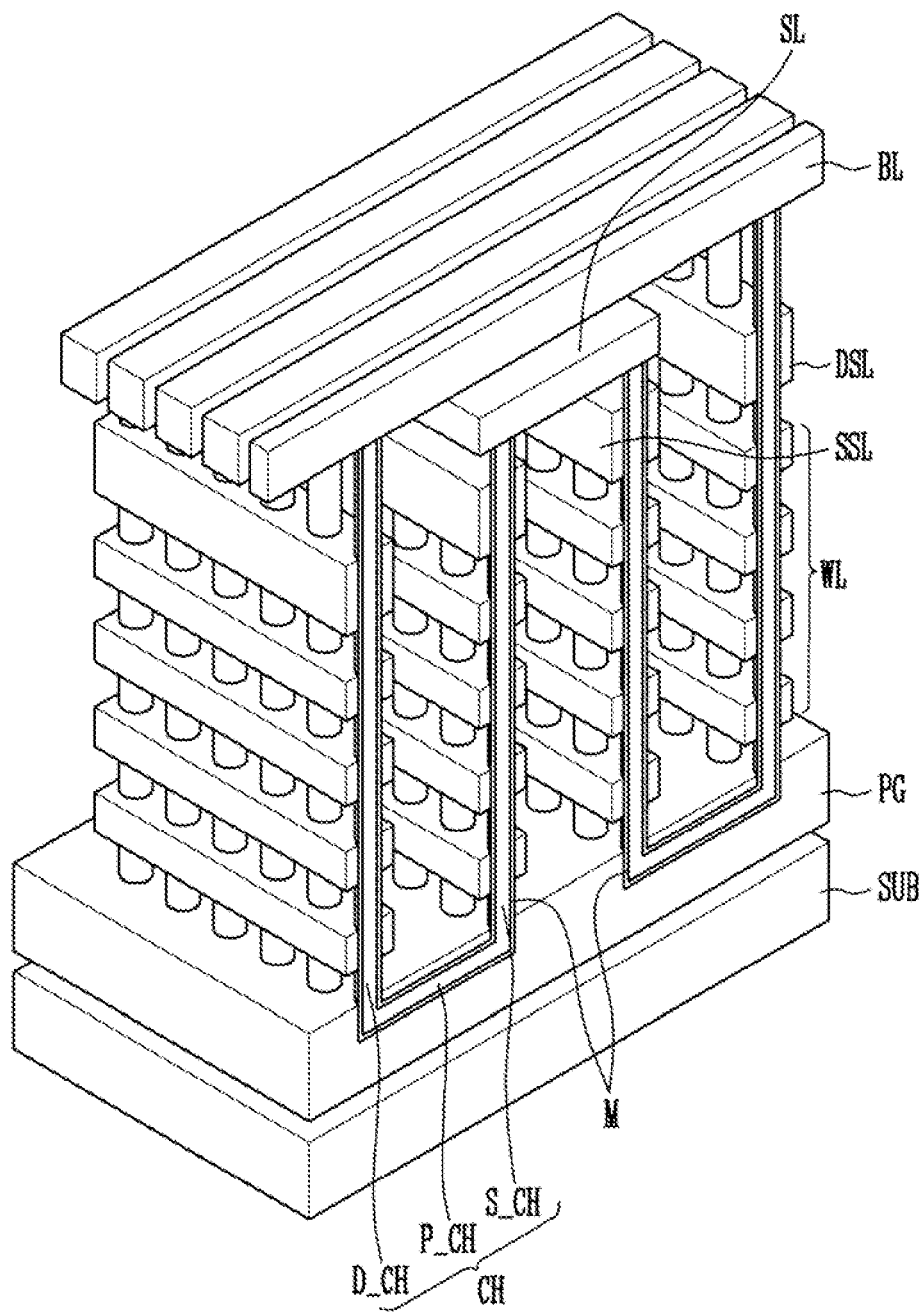
FIGS. 4 and 5 are perspective views illustrating a cell structure of a semiconductor device according to an embodiment of the present invention.
Figure 5:
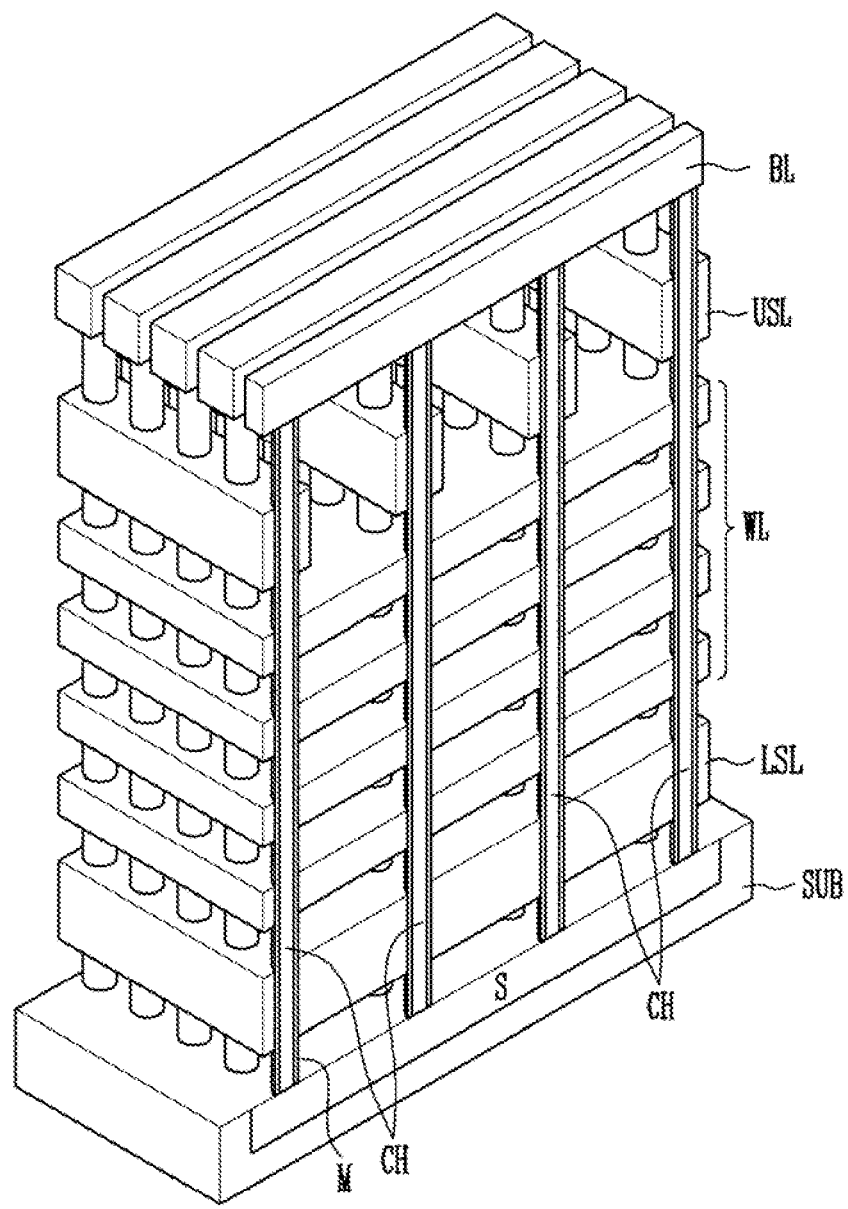

FIGS. 4 and 5 are perspective views illustrating a cell structure of a semiconductor device according to an embodiment of the present invention. In FIGS. 4 and 5, an insulating layer is omitted for convenience of explanation.

FIG. 4 illustrates an example in which a channel layer CH has a U shape.

As shown in FIG. 4, a cell structure includes pipe gates PG, word lines WL, at least one drain select line DSL, and at least one source select line, SSL, which are stacked on the substrate SUB. The word lines WL, the drain select line DSL, and the source select line SSL are formed by extending the conductive patterns of the contact region to the cell region.

The cell structure further includes channel layers CH of a U shape. Here, the channel layers CH each include a pipe channel layer P_CH formed in the pipe gate PG, and source and drain side channel layers S_CH and D_CH connected to the pipe channel layer P_CH.

Here, the source side channel layers S_CH penetrate the word lines WL and the source select line SSL, and the drain side channel layers D_CH penetrate the word lines WL and the drain select line DSL. In addition, the source side channel layers S_CH are connected to the source line SL, and the drain side channel layers D_CH are connected to the bit lines BL.

Further, the semiconductor device further includes a thin layer M interposed between the channel layers CH and the word lines WL. The thin layer M may include at least one of a blocking insulating layer, a data storage layer, and a tunnel insulating layer. For example, the thin layer M may include a tunnel insulating layer surrounding a sidewall of each of the channel layers CH. Further, the thin layer M may further include a data storage layer surrounding the tunnel insulating layer. Moreover, the thin layer M may further include a blocking insulating layer surrounding the data storage layer.

According to the above structure, at least one drain select transistor, memory cells, and at least one source select transistor, which are serially connected, are composed of one string, and are arranged in a U shape.

FIG. 5 illustrates an example in which the channel layer CH has a straight vertical shape with respect to the surface of the substrate SUB.

As shown in FIG. 5, the cell structure includes at least one lower select line LSL, word lines WL, and at least one upper select line USL, which are sequentially stacked on the substrate SUB in which a source area S is formed. Here, the word lines WL have a plate shape, and at least one of the upper and lower select lines USL and LSL has a line shape. The lower select line LSL, the word lines WL, and the upper select line USL are formed by extending the conductive patterns of the contact region to the cell region.

The semiconductor device further includes channel layers CH that protrude from the substrate SUB and penetrate the lower select line LSL, the word lines WL, and the upper select line USL. Here, upper portions of the channel layers CH are connected to the bit lines BL, and lower portions of the channel layers CH are connected to the source area S.

In addition, the semiconductor device further includes a thin layer M interposed between the channel layers CH and the word lines WL. Detailed configuration of the thin layer M is the same as described above with reference to FIG. 4.

According to the above structure, at least one lower select transistor, memory cells, and at least one upper select transistor, which are serially connected, are composed of one string, and are arranged in a row.

For reference, the semiconductor devices described above with reference to FIGS. 4 and 5 may be manufactured by applying the manufacturing method described above, and explanation of a more detailed manufacturing method will be omitted.

For example, only the contact region of a three-dimensional semiconductor device is explained as an example with reference to the above drawings. However, the present invention is not limited to the embodiments set forth herein, and is applicable to any semiconductor device including the contact structure. For example, the present invention is also applicable to a two-dimensional semiconductor device.

Figure 6:
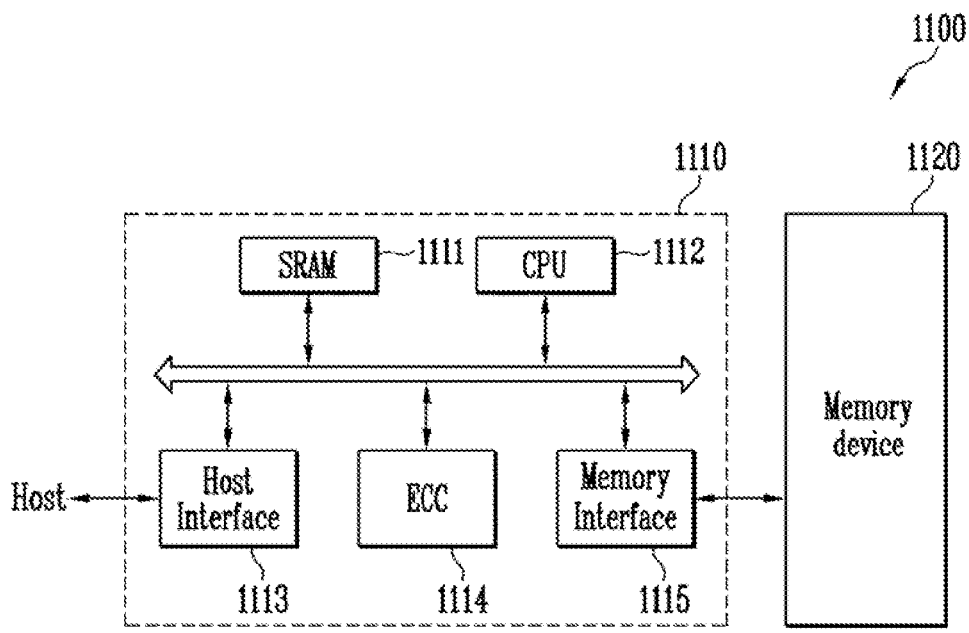
FIG. 6 is a block diagram illustrating a memory system according to an embodiment of the present invention.

FIG. 6 is a block diagram illustrating a memory system according to an embodiment of the present invention.

Referring to FIG. 6, the memory system 1100 according to an embodiment of the present invention includes a memory device 1120 and a memory controller 1110.

The memory device 1120 has the structure described in the above embodiments with reference to FIGS. 1 to 5. Further, the memory device 1120 may be a multi-chip package including a plurality of flash memory chips.

The memory controller 1110 is formed to control the memory device 1120, and includes a static random access memory (SRAM) 1111, a central processing unit (CPU) 1112, a host interface 1113, an error correcting code (ECC) 1114, and a memory interface 1115. The SRAM 1111 is used as an operating memory, the CPU 1112 performs various control operations for data exchange of the memory controller 1110, and the host interface 1113 includes a data exchange protocol of a host connected to the memory system 1100. Further, the ECC 1114 detects and corrects errors included in data read from the memory device 1120, and the memory interface 1115 performs an interface with the memory device 1120. Moreover, the memory controller 1110 may further include a read only memory (ROM), etc. storing code data for interfacing with the host.

The memory system 1100 having the above configuration may be a memory card or a solid state disk (SSD) in which the memory device 1120 and the memory controller 1110 are coupled. For example, if the memory system 1100 is the SSD, the memory controller 1110 may communicate with the outside through one of various interface protocols such as a Universal Serial Bus (USB), a MultiMediaCard (MMC), a Peripheral Component Interconnect-Express (PCI-E), a Serial Advance Technology Attachment (SATA), a Parallel Advance Technology Attachment (PATA), an Enhanced Small Device Interface (ESDI), an Integrated Drive Electronics (IDE), and so on.

Figure 7:
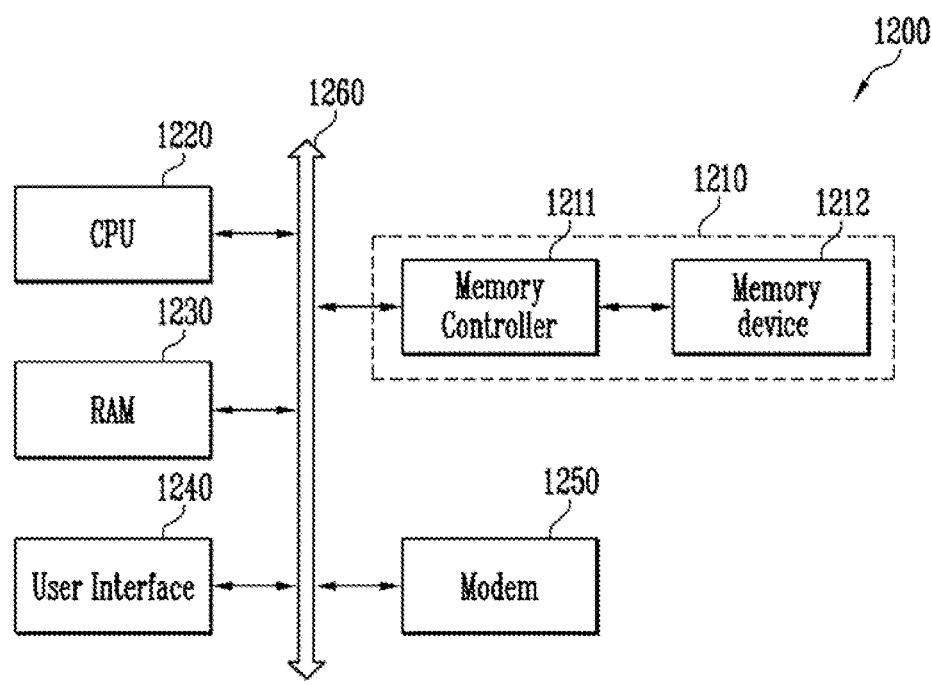
FIG. 7 is a block diagram illustrating a computing system according to an embodiment of the present invention.

FIG. 7 is a block diagram illustrating a computing system according to an embodiment of the present invention.

Referring to FIG. 7, the computing system 1200 according to an embodiment of the present invention may include a CPU 1220, a RAM 1230, a user interface 1240, a modem 1250 and a memory system 1210, which are electrically connected to a system bus 1260. Further, if the computing system 1200 is a mobile device, a battery for providing an operating voltage for the computing system 1200 may be further included in the computing system 1200. Also, an application chipset, a camera image processor (CIS), a mobile dynamic random access memory (DRAM) and so on may be further included in the computing system 1200.

As described above with reference to FIG. 6, the memory system 1210 may include a memory device 1212 and a memory controller 1211.

The present invention may guarantee an etching margin and an overlay margin in a process of forming a contact hole to form a contact plug by forming a conductive pattern to be bent in a contact region via a sub-pattern. Accordingly, the present invention may lower a level of difficulty of the process of forming the contact plug in the contact region of the conductive pattern.

In the drawings and specification, there have been disclosed typical exemplary embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
a substrate on which a contact region and a cell region are defined;
sub-patterns formed in the contact region, on the substrate, wherein the sub-patterns are spaced apart from each other, formed in the same contact region, located at the same level, and not overlapped with the cell region; and
insulating patterns and conductive patterns stacked alternately over the sub-patterns,
wherein the insulating patterns and the conductive patterns are upwardly bent over the sub-patterns, and
wherein first portions of the insulating patterns and the conductive patterns, covering the sub-patterns, have greater thicknesses than respective second portions of the insulating patterns and the conductive patterns, disposed between the sub-patterns.

2. The semiconductor device of claim 1, wherein ends of the insulating patterns and the conductive patterns are formed as a stepped structure in the contact region.

3. The semiconductor device of claim 2, wherein each of steps of the stepped structure comprises at least one of the insulating patterns and at least one of the conductive patterns.

4. The semiconductor device of claim 2, wherein the sub-patterns are arranged in lower portions of steps of the stepped structure.

5. The semiconductor device of claim 1, further comprising:
contact plugs connected to portions of the conductive patterns, covering the sub-patterns.

6. The semiconductor device of claim 5, wherein the contact plugs are connected to edges of the portions of the conductive patterns.

7. The semiconductor device of claim 1, wherein the insulating patterns and the conductive patterns extend to the cell region.

8. The semiconductor device of claim 7, further comprising:
channel layers penetrating the insulating patterns and the conductive patterns formed in the cell region.

9. A method of manufacturing a semiconductor device, comprising:
forming sub-patterns on a substrate, wherein the sub-patterns are spaced apart from each other and located at the same level;
forming a stepped structure including insulating patterns and conductive patterns,
wherein the insulating patterns and the conductive patterns are stacked alternately over the sub-patterns and are upwardly bent over the sub-patterns; and
forming contact plugs connected to the conductive patterns of the stepped structure,
wherein the contact plugs have different depths to be in contact with bent portions of the conductive patterns, and
wherein the bent portions cover the sub-patterns, and a lower pattern among the conductive patterns includes a larger number of bent portions than an upper pattern among the conductive patterns, the lower pattern disposed between the substrate and the upper pattern,
wherein the forming of the stepped structure comprises:
alternately stacking first material layers and second material layers along the sub-patterns, and
wherein first portions of the first material layers and the second material layers, covering the sub-patterns, have greater thicknesses than respective second portions of the first material layers and the second material layers, disposed between the sub-patterns.

10. The method of claim 9, wherein the forming of the stepped structure further comprises:
patterning ends of the first material layers and the second material layers as the stepped structure; and
forming a slit penetrating the first material layers and the second material layers.

11. The method of claim 10, wherein the first material layers include an insulating pattern material, and the second material layers include a conductive pattern material.

12. The method of claim 10, wherein the first material layers include an insulating pattern material, and the second material layers include a sacrificial material with etch selectivity with respect to the insulating pattern material of the first material layers.

13. The method of claim 12, after the forming of the slit, further comprising:
removing the second material layers that are formed of the sacrificial material, to form recess areas; and
filling the recess areas with a conductive material to form the conductive patterns.

14. The method of claim 10, wherein the first material layers include a sacrificial material with etch selectivity with respect to a material of the second material layers, and the material of the second material layers includes a conductive pattern material.

15. The method of claim 14, after the forming of the slit, further comprising:

removing the first material layers that are formed of the sacrificial material, to form recess areas; and forming the insulating patterns in insides of the recess areas.

16. The method of claim 9, wherein the contact plugs are connected to portions of the conductive patterns, covering the sub-patterns.

17. The method of claim 16, wherein the contact plugs are connected to edges of the portions of the conductive patterns.

* * * * *